(12) United States Patent
Li

(10) Patent No.: US 10,088,298 B2
(45) Date of Patent: *Oct. 2, 2018

(54) METHOD OF IMPROVING LATERAL RESOLUTION FOR HEIGHT SENSOR USING DIFFERENTIAL DETECTION TECHNOLOGY FOR SEMICONDUCTOR INSPECTION AND METROLOGY

(71) Applicant: KLA-Tencor Corporation, Milpitas, CA (US)

(72) Inventor: Shifang Li, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/255,255

(22) Filed: Sep. 2, 2016

(65) Prior Publication Data

US 2017/0067732 A1    Mar. 9, 2017

Related U.S. Application Data

(60) Provisional application No. 62/214,720, filed on Sep. 4, 2015.

(51) Int. Cl.
| | | |
|---|---|---|
| G01B 11/24 | (2006.01) | |
| G01B 11/06 | (2006.01) | |
| G02B 1/11 | (2015.01) | |
| G02B 5/08 | (2006.01) | |
| G02B 27/00 | (2006.01) | |
| G02B 27/09 | (2006.01) | |

(Continued)

(52) U.S. Cl.
CPC ............ *G01B 11/0608* (2013.01); *G02B 1/11* (2013.01); *G02B 5/0808* (2013.01); *G02B 7/38* (2013.01); *G02B 27/0025* (2013.01); *G02B 27/09* (2013.01); *G02B 27/0911* (2013.01); *G02B 27/14* (2013.01); *G03F 7/70* (2013.01); *G01B 2210/56* (2013.01)

(58) Field of Classification Search
CPC ....... G01B 11/24; G01B 11/25; G01B 11/306; G01B 11/245; G06T 7/0057
USPC ....................................................... 356/601
See application file for complete search history.

(56) References Cited

U.S. PATENT DOCUMENTS

| | | |
|---|---|---|
| 5,053,628 A | 10/1991 | Yamamoto et al. |
| 5,155,544 A | 10/1992 | Vandenberg et al. |

(Continued)

FOREIGN PATENT DOCUMENTS

| | | |
|---|---|---|
| JP | 2001057169 | 2/2001 |
| JP | 2002022415 | 1/2002 |

(Continued)

OTHER PUBLICATIONS

ISA/KR, International Search Report for PCT/US2016/050281 dated Dec. 19, 2016.

*Primary Examiner* — Md M Rahman
(74) *Attorney, Agent, or Firm* — Hodgson Russ LLP

(57) ABSTRACT

A system that can be used for semiconductor height inspection and metrology includes a complementary plate that is used with a beam splitter to create desired astigmatism and to remove chromatic aberration. Simultaneous optimization of lateral resolution and sensitivity can be enabled. The complementary plate can be made of the same material and have the same thickness as the beam splitter.

16 Claims, 7 Drawing Sheets

(51) Int. Cl.
  *G02B 27/14* (2006.01)
  *G02B 7/38* (2006.01)
  *G03F 7/20* (2006.01)

(56) References Cited

U.S. PATENT DOCUMENTS

| | | |
|---|---|---|
| 5,159,412 A | 10/1992 | Willenborg et al. |
| 5,684,595 A | 11/1997 | Kato et al. |
| 6,222,197 B1 | 4/2001 | Kojima |
| 6,382,799 B1* | 5/2002 | Nishikawa ............ G03B 21/008 348/771 |
| 6,504,614 B1* | 1/2003 | Messerschmidt ....... G01J 3/453 356/455 |
| 6,541,169 B1 | 4/2003 | Okino et al. |
| 7,266,072 B2 | 9/2007 | Shinoda et al. |
| 7,365,857 B2 | 4/2008 | Holmes et al. |
| 7,411,883 B2 | 8/2008 | Kimura et al. |
| 7,557,910 B2 | 7/2009 | Baran et al. |
| 8,054,453 B2 | 11/2011 | Harrison |
| 2003/0169423 A1* | 9/2003 | Finarov ............... G03F 7/70633 356/401 |
| 2005/0224693 A1 | 10/2005 | Ikenaka et al. |
| 2006/0018025 A1 | 1/2006 | Sharon et al. |
| 2006/0033921 A1 | 2/2006 | Den Boef et al. |
| 2009/0059216 A1 | 3/2009 | Shibata et al. |
| 2010/0027001 A1 | 2/2010 | Moser et al. |
| 2011/0317172 A1* | 12/2011 | Tamiya ............... G01B 11/0608 356/614 |
| 2014/0098363 A1 | 4/2014 | Hey |
| 2014/0160558 A1 | 6/2014 | Togashi et al. |
| 2015/0109623 A1* | 4/2015 | Abdulhalm ........ G01B 9/02004 356/479 |
| 2016/0178514 A1 | 6/2016 | Li et al. |
| 2016/0377412 A1 | 12/2016 | Li et al. |

FOREIGN PATENT DOCUMENTS

| | | |
|---|---|---|
| JP | 2004156978 | 6/2004 |
| JP | 2007049155 | 2/2007 |
| JP | 4287850 | 7/2009 |

* cited by examiner

METHOD OF IMPROVING LATERAL RESOLUTION FOR HEIGHT SENSOR USING DIFFERENTIAL DETECTION TECHNOLOGY FOR SEMICONDUCTOR INSPECTION AND METROLOGY

CROSS-REFERENCE TO RELATED APPLICATIONS

This application claims priority to the provisional patent application filed Sep. 4, 2015 and assigned U.S. App. No. 62/214,720, the disclosure of which is hereby incorporated by reference.

FIELD OF THE DISCLOSURE

This disclosure relates to semiconductor wafer inspection and metrology.

BACKGROUND OF THE DISCLOSURE

The semiconductor industry requires three-dimensional ("3D") inspection and/or metrology processes for silicon wafers. Such inspection or metrology can be used, for example, to test the through silicon via ("TSV") and bump structure, pillar and bump structure in mid-end-of-line (MEOL) applications, or the particle shape (e.g., size and height) on a backside of wafers for extreme ultraviolet (EUV) lithograph applications. Typical techniques for inspection or metrology include: (1) triangulation; (2) geometric shadow; (3) various confocal microscope techniques; and (4) white-light (or broadband light) interferometry. Existing triangulation and geometric shadow techniques typically do not provide required accuracy and precision for these applications when the characteristic size of the structures becomes smaller. For example, existing triangulation and geometric shadow techniques can lack the required accuracy and precision for 3D inspection when the target structure height shrinks below 10 µm. Confocal and interferometry methods often do not provide required throughput or are too expensive for 3D inspection in MEOL and back-end-of-line (BEOL). Therefore, what is needed is an inspection and metrology technique that can provide better accuracy for small structures and is more cost-effective.

BRIEF SUMMARY OF THE DISCLOSURE

In a first embodiment, a system is provided. The system comprises a light source configured to provide light; a stage configured to hold a wafer to receive the light from the light source; a beam splitter; and a complementary plate disposed in a path of the light reflected from the wafer and the beam splitter. The complementary plate is configured to create astigmatism and to remove chromatic aberration. In an instance, the complementary plate is configured to remove at least 99.9% of the chromatic aberration.

The system can include an objective lens configured to illuminate the wafer with light from the light source and to collect light reflected from the wafer.

The system can include a sensor configured to receive the light reflected from the wafer and a processor in electrical communication with the sensor. The processor can be configured to determine a height of an illuminated region on a surface of the wafer relative to a normal surface of the wafer. The sensor can detect whether the light reflected from the wafer is under-focused or over-focused.

The sensor can include two photodiodes. The two photodiodes can receive different quantities of the light reflected from the wafer when the light reflected from the wafer is under-focused or over-focused.

The sensor can include two photodiodes. The system can include a knife-edge mirror configured to receive light reflected from the wafer and a second sensor configured to receive the light reflected from the wafer that is reflected by the knife-edge mirror. The second sensor can include two photodiodes. The knife-edge mirror can include a reflective film and an anti-reflection film that are both disposed on the knife-edge mirror thereby forming a boundary between the reflective film and the anti-reflection film. The knife-edge mirror can be positioned at a focal point of the light reflected from the wafer such that the reflective film is configured to block at least some of the light reflected from the wafer. The knife-edge mirror can be configured such that a portion of the light blocked by the knife-edge mirror is different when the light reflected from the wafer is under-focused or over-focused. The knife-edge mirror can be positioned at a non-perpendicular angle relative to an axis of the light reflected from the wafer.

The sensor can be a photodiode array.

The stage can be configured to scan the wafer relative to the light from the light source.

The complementary plate can be fabricated of the same material and can have the same thickness as the beam splitter.

The complementary plate can be positioned at an angle opposite that of the beam splitter relative to an axis of the light.

The light can be configured to be projected onto the wafer in a line.

The system can include a slit configured to shape the light.

In a second embodiment, a method is provided. The method includes reflecting light off a beam splitter; reflecting the light off a surface of a wafer; and passing the light through the beam splitter and a complementary plate. The complementary plate is configured to create astigmatism and to remove chromatic aberration. In an instance, at least 99.9% of the chromatic aberration is removed using the complementary plate.

The method can include receiving the light with at least one sensor after the light passes through the complementary plate and determining, using a processor, a height of an illuminated region on the surface of the wafer relative to a normal surface of the wafer using a reading from the at least one sensor.

The method can include passing the light through a knife-edge mirror. The knife-edge mirror can include a reflective film and an anti-reflection film that are both disposed on the knife-edge mirror thereby forming a boundary between the reflective film and the anti-reflection film. The knife-edge mirror can be positioned at a focal point of the light reflected from the wafer such that the reflective film is configured to block at least some of the light reflected from the wafer and such that a portion of the light blocked by the knife-edge mirror is different when the light reflected from the wafer is under-focused or over-focused. The method also can include splitting the light from the knife-edge mirror into two quantities and determining whether the quantities are equal. The method also can include reflecting part of the light from the knife-edge mirror to a second sensor. The method also can include determining whether the light is under-focused or over-focused using a reading from the second sensor.

The method can include shaping the light projected onto the wafer into a line. The method also can include scanning the wafer relative to the light.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments of the system and method disclosed herein enable simultaneous optimization of lateral resolution and sensitivity. A complementary plate (compensator) is used with a beam splitter to create desired astigmatism and remove chromatic aberration. For example, creating the desired astigmatism can keep the wafer in focus along the slit's orientation and can provide the desired focus offset perpendicular to the slit for height sensitivity. This can preserve both lateral resolution and height sensitivity.

Embodiments, as disclosed herein, can be combined with a height sensor to determine height of a structure on a wafer. Thus, embodiments of the system and method disclosed herein can be used for semiconductor height inspection and metrology. This system can provide a fast and cost-effective solution for structure height inspection and metrology, such as for MEOL/BEOL applications.

Figure 1:
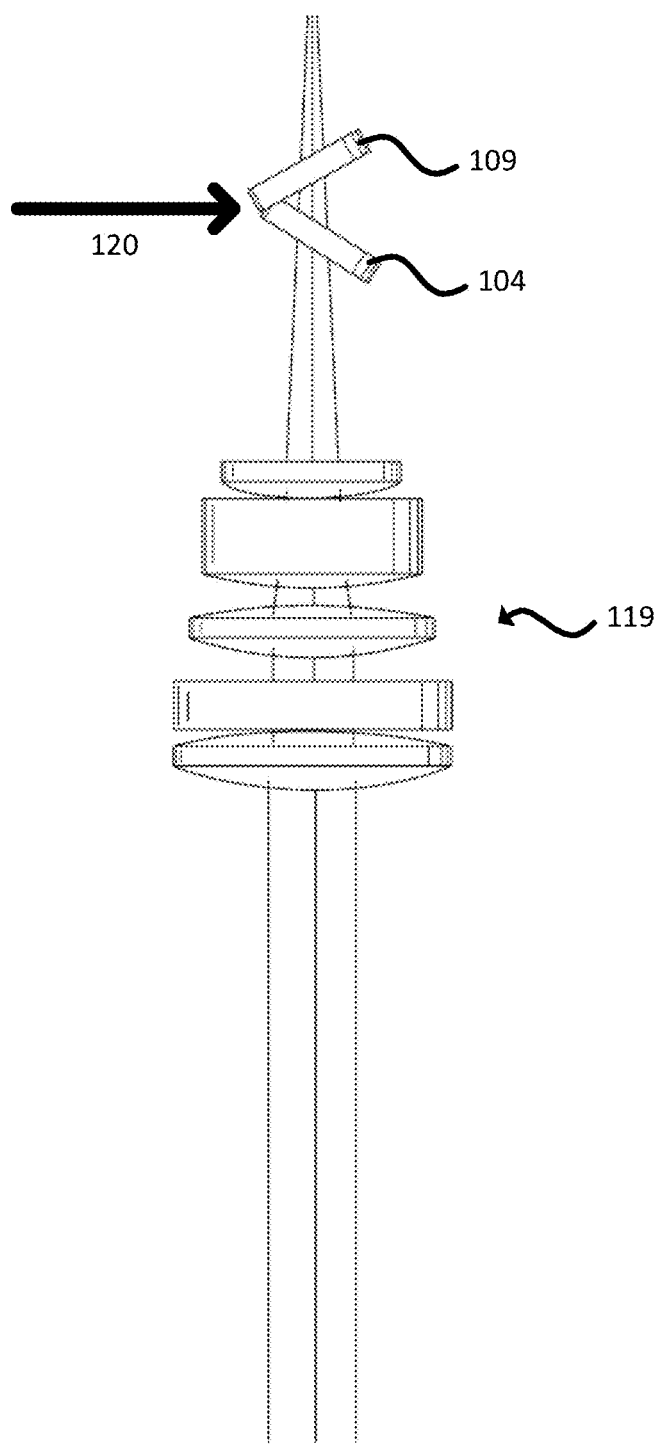
FIG. 1 is a view of an embodiment of the complementary plate with the beam splitter in accordance with an embodiment of the disclosure.
Figure 2:
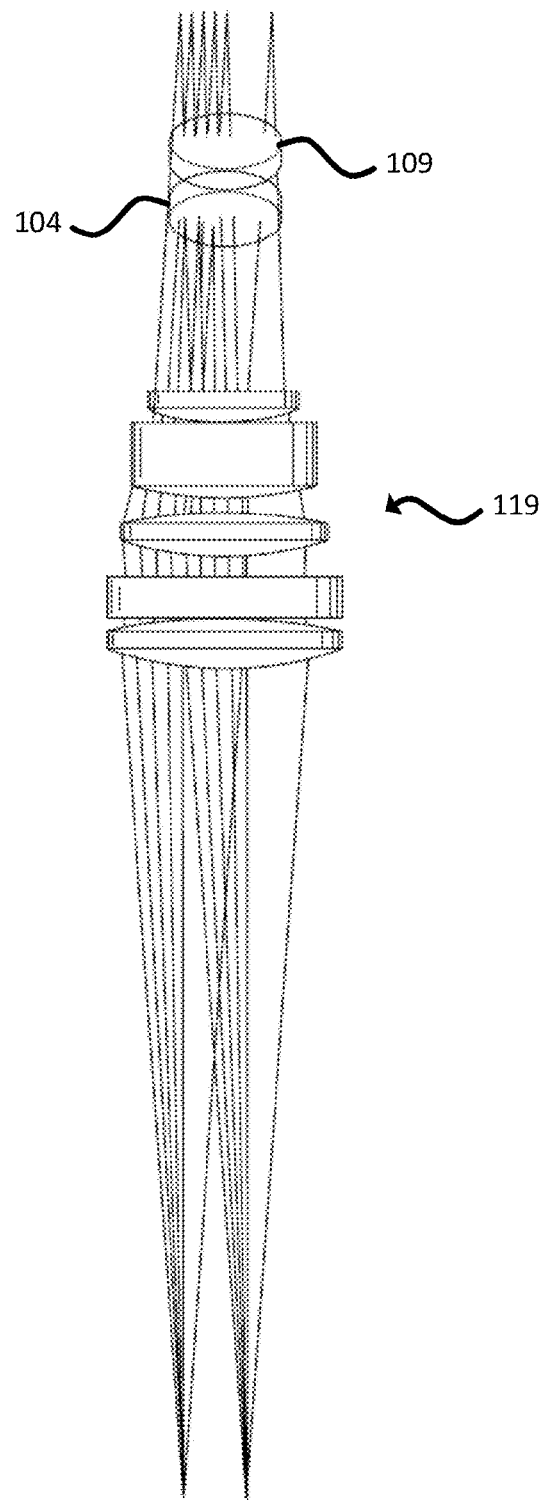
FIG. 2 is another view of an embodiment of the complementary plate with the beam splitter of FIG. 1.

One exemplary implementation of the complementary plate 109 is shown in FIGS. 1 and 2. A beam splitter 104 receives light from a light source (represented by the arrow 120). Some light passes through the relay 119 to a wafer (not illustrated). Light reflected off the wafer passes through the relay 119 to the beam splitter 104 and the complementary plate 109. The light projected at and reflecting off the wafer also can pass through an objective lens or other lenses. While illustrated as overlapping, the complementary plate 109 and the beam splitter 104 may be separated from one another or may abut one another.

The complementary plate 109 can be fabricated of the same material and can have the same thickness as the beam splitter 104. The thicknesses of the complementary plate 109 and the beam splitter 104 may be the same to the 0.1 mm, 0.01 mm, or 0.001 mm. For example, the complementary plate 109 can be fabricated of an optical glass configured to transmit light in an application wavelength range. A typical thickness may be in the range from approximately 1-3 mm, including all values to the 0.1 mm therebetween. In an instance, both the complementary plate 109 and the beam splitter 104 have thicknesses of 2 mm. The relative thicknesses of the complementary plate 109 and the beam splitter 104 can be a function of the numerical aperture (NA) at the beam splitter to complementary plate space or of the magnification from the wafer.

The complementary plate 109 can be set at the same angle as the beam splitter 104. Typically, the angle of the complementary plate 109 is set to be 45° relative to the path of the incoming light, though other angles are possible. The beam splitter 104 also may be set at 45°, though the complementary plate 109 and beam splitter 104 may be oppositely arranged across an imaginary axis or the path of the incoming light. In an instance, there is a 90° angle between surfaces of the complementary plate 109 and beam splitter 104. The design tolerance of the angle of the complementary plate 109 and beam splitter 104 may be near zero.

For some design considerations, the angle of the complementary plate 109 can be different from 45°. For example, the complementary plate 109 can be set to an angle that is not 45° to provide a feasible thickness that reaches the desired astigmatism or to fit the complementary plate 109 among the other components in the system.

In another embodiment, the complementary plate 109 can be different in material, thickness, and/or angle than the beam splitter, but can still be designed to provide the desired performance.

Figure 4:
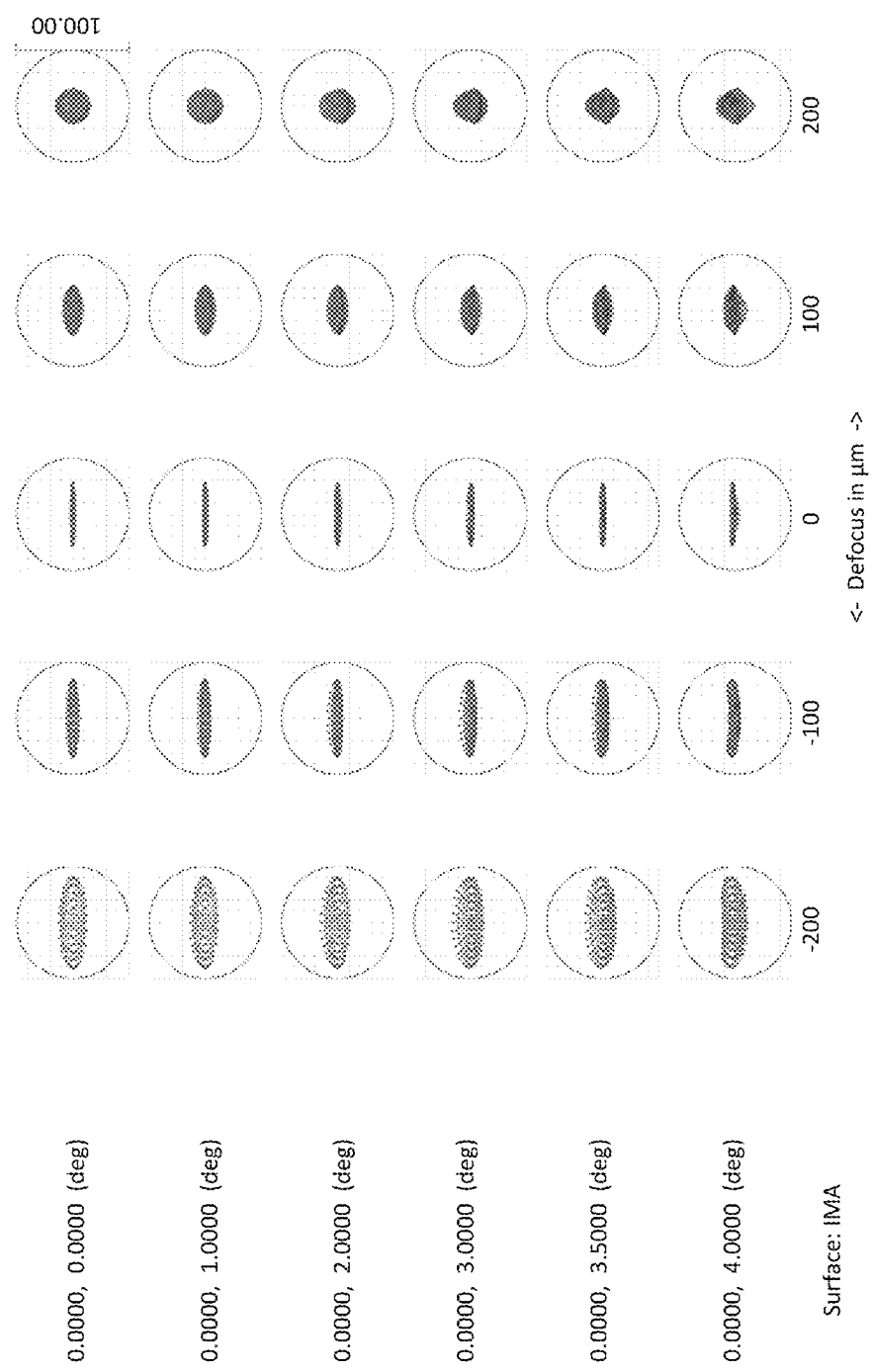
FIG. 4 represents results with the complementary plate.

In FIG. 2, when a line on the wafer (not illustrated) is in focus, each point on the line is imaged as a line perpendicular to the slit, as shown in the mid-column of FIG. 4. The width of the line of the mid-column may be a diffraction limited image of the points on the wafer, preserving a high lateral resolution in an orthogonal orientation. The length of the line in the mid-column represents the fan-out of rays due to focus offset desired using the beam splitter and complementary plate. When a point on the wafer has a different height, its image point is shifted and the resulted point-spread-function is represented as another column in the FIG. 4. Thus, the line's length gets shorter (approaching the focus) or longer (away from the focus), providing the height sensitivity for the points on the wafer. At the same time, the width of the line changes very little within the depth of focus (DOF). Thus, the lateral resolution is preserved.

The relay 119 in FIGS. 1 and 2 can deflect the rays from a point on the wafer to a focus or image point. For example, the relay 119 can deflect the rays to the top converging point in FIG. 1. The relay 119 can include one or more lenses. There also can be other optics configured to manipulate the rays before the rays reach the relay 119, which are not shown in FIGS. 1 and 2.

Figure 3:
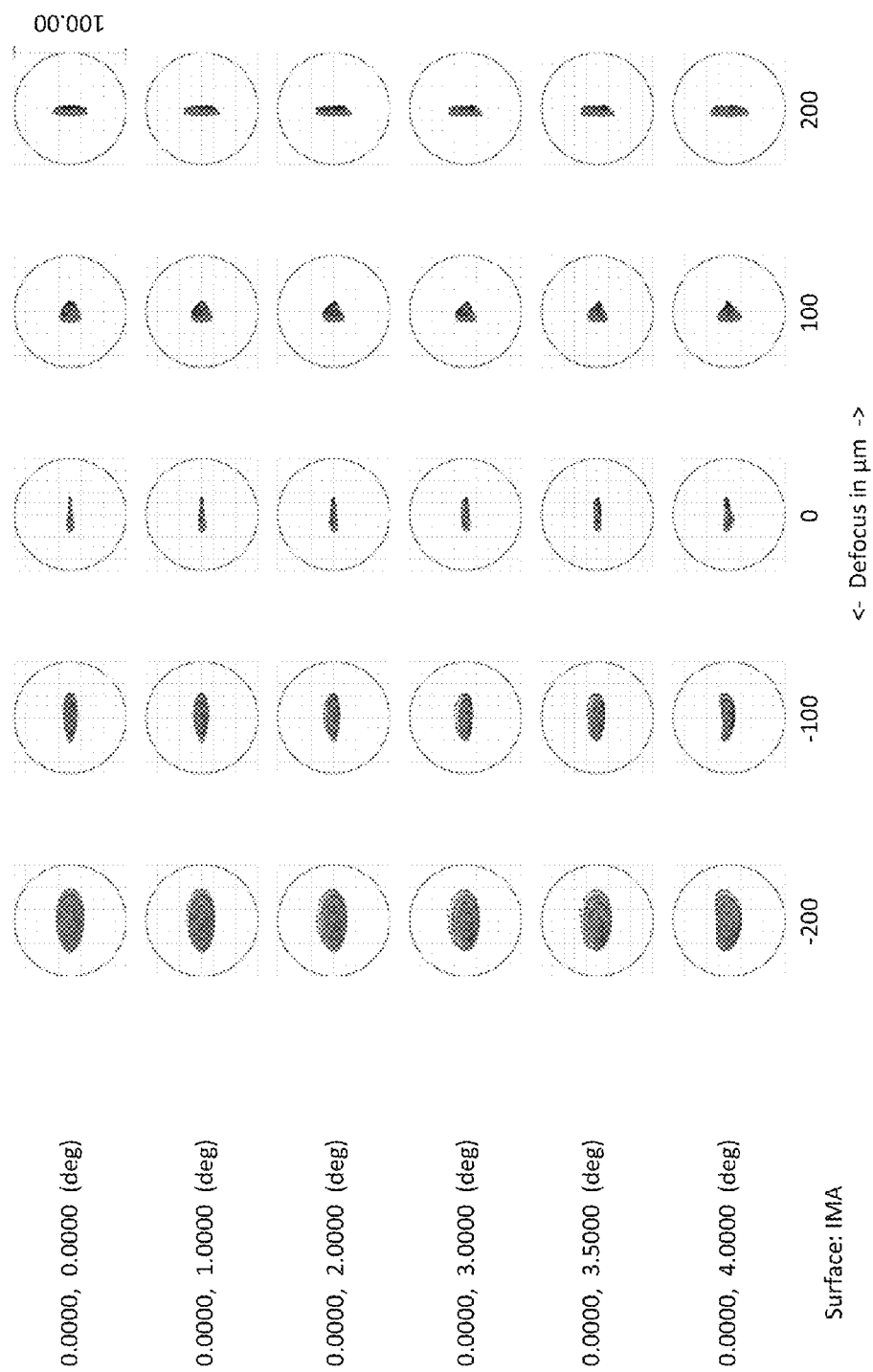
FIG. 3 represents results without the complementary plate.

An exemplary performance is shown in FIGS. 3 and 4. Without the beam splitter and the complementary plate, the relay 119 is essentially free from any aberration. FIG. 3 shows the performance when the beam splitter is in place without the complementary plate. Both chromatic aberration and astigmatism are significant. The astigmatism can be used to optimize lateral resolution, but the chromatic aberration needs to be removed to ensure system accuracy. When the beam splitter is inserted to the beam path with a complementary plate, such as shown in FIG. 1 or 2, the chromatic aberration is removed as shown in the FIG. 4.

The complementary plate 109 can introduce desired astigmatism and remove chromatic aberration. The astigmatism can provide a way to design a system with high lateral resolution (by focusing along the slit) and maximum sensitivity (by defocusing perpendicularly to the slit so it seats on a maximum slope point).

In an instance, total removal of chromatic aberration occurs using the complementary plate. In another example, near-total removal of the chromatic aberration occurs using the complementary plate. For example, 0.1% or less of the chromatic aberration may remain and the complementary plate may be configured to remove at least 99.9% of the chromatic aberration that would be present without the complementary plate.

Figure 5:
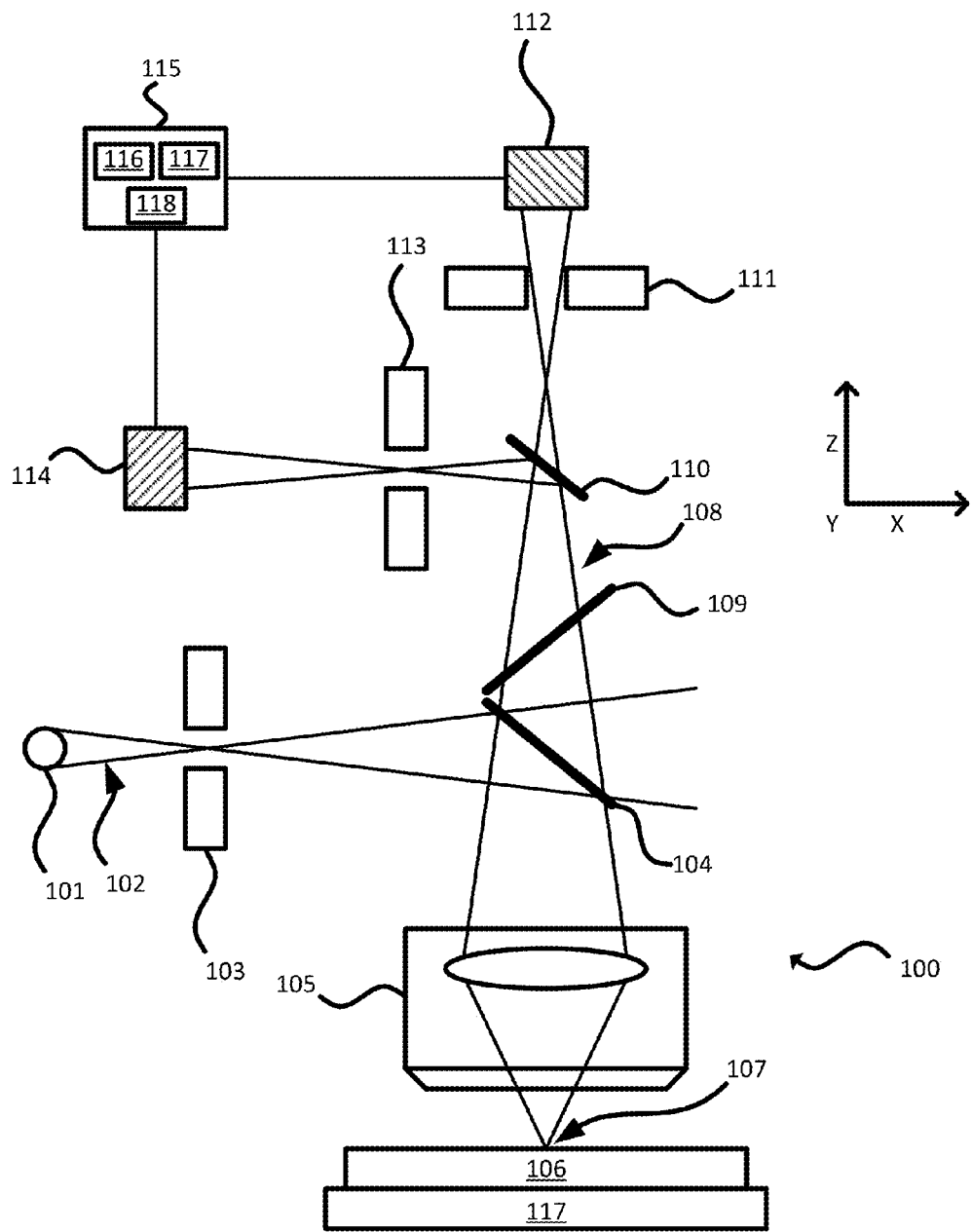
FIG. 5 is an embodiment in accordance with the present disclosure using two photodiodes.
Figure 6:
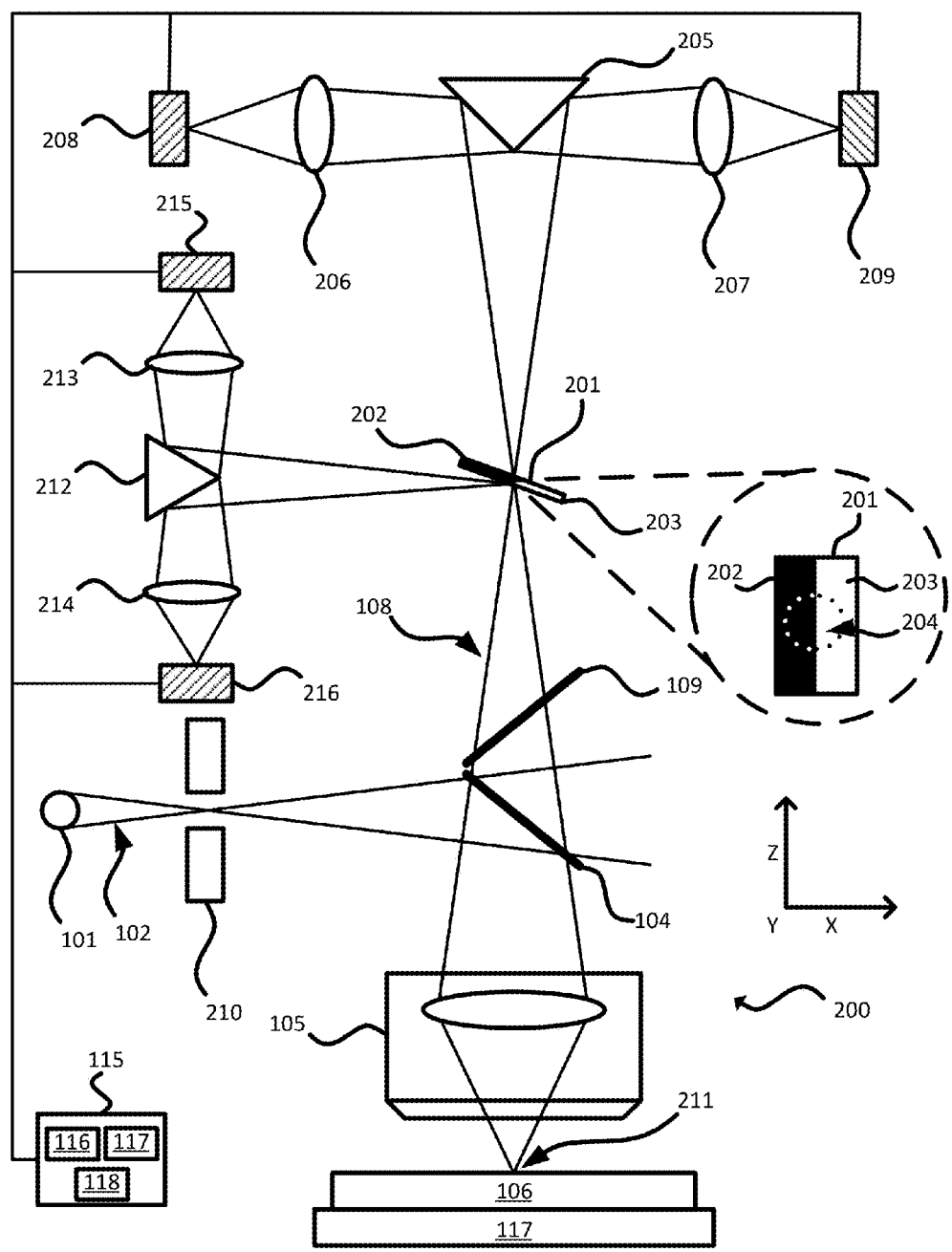
FIG. 6 is an embodiment in accordance with the present disclosure using four photodiodes.

The complementary plate is used in the systems shown in FIGS. 5 and 6. While these two embodiments are shown, other systems also can benefit from use of a complementary plate. Without the complementary plate, the systems of FIGS. 5 and 6 may experience lower performance and/or limited lateral resolution. First, the beam splitters in the finite conjugated system can cause chromatic and astigmatism aberration that can lower performance. Second, the trade-off of focus offset and lateral resolution in a line scan scheme can result in a limited lateral resolution along the slit. The lateral resolution is limited by how much focus offset is for the two slits. A small offset may result in lower sensitivity. A large offset may result in lower lateral resolution. For example, without the complementary plate, the maximum lateral resolution point is at focus where the sensitivity is exactly zero. If the slope of a focus curve is defocused to get acceptable sensitivity, then the lateral resolution will be lower by at least a factor of two.

The complementary plate 109 can be positioned in the beam downstream from the pin-hole or slit shown in FIG. 5 or FIG. 6. In an instance, the complementary plate 109 is positioned in a path of the light between the second beam splitter 110 and the sensor. The exact location of the complementary plate 109 can vary, though it typically is in the range as shown in FIG. 1. However, the complementary plate 109 may not be too close to the focal point to avoid light scattering or wave front deformation by defects on the beam splitter or complementary plate. The position of the complementary plate 109 also can vary based on its physically dimensions and size so that it can be placed in the system.

FIG. 5 is an embodiment with two photodiodes 112, 114. The system 100 has a light source 101 that is configured to provide light 102 having a spectrum of wavelength range. In some embodiments, the light source 101 may be configured to provide white light (i.e., broadband light in the visible spectrum) or light that is partially or completely outside of the visible spectrum. In an exemplary embodiment, the light 102 provided by the light source 101 includes wavelengths ($\lambda$) from 400-800 nm.

A laser light source can be used for the light source 101, which can provide a higher brightness compared to a conventional incoherent light source, such as those used for white light interferometry and chromatic confocal microscopy. Laser light sources, such as diode lasers, can improve lifetime, stability, and thermal control of the light source. The light source 101 may be, for example, a visible diode laser.

The light 102 is projected toward a source pinhole 103 and a beam splitter 104, which splits the light 102 into two quantities as seen in FIG. 5. The light 102 is then projected through an objective lens 105, which may be a high magnification objective lens. The objective lens can be configured to illuminate the wafer with light from the light source 101 and collect light reflected from the wafer 106. Some or all of the light 102 passes through the objective lens 105 onto at least a portion of a sample at an illumination point 107. The sample may be, for example, a wafer 106. The spot size of the light 102 at the illumination point 107 may be diffraction limited.

The wafer 106 is disposed on a stage 117 configured to position the wafer 106 to receive the light 102. The stage 117 can be fixed or can scan in the x-direction, y-direction, and/or z-direction. The wafer 106 may be clamped to the stage 117 in an instance, such as through mechanical and/or electrostatic clamping. For example, the stage 117 can translate the wafer 106 in a plane perpendicular to the axis of the light 102 or the objective lens 105 (e.g., the x-y plane).

Reflected light 108 passes through the beam splitter 104 and a complementary plate 109 to a second beam splitter 110. Some of the light then passes from the second beam splitter 110 through a pinhole 111 to a first photodiode 112 while some of the light then emerges from the second beam splitter 110 through a pinhole 113 to a second photodiode 114.

The system 100 can distinguish whether the detected feature on the wafer 106 is above or below the normal surface of the wafer 106 according to the relative intensity of the two photodiodes 112, 114. Which of the photodiodes 112, 114 receives more or less light can be used to determine if the reflected light 108 is under-focused or over-focused. Thus, if the photodiodes 112, 114 do not receive equal quantities of the reflected light 108, then it can be determined that the detected feature on the wafer 106 is above or below the normal surface of the wafer 106.

The beam splitters 104 and 110 in the finite conjugated system 100 can cause chromatic and astigmatism aberration that can lower performance. Furthermore, the trade-off of focus offset and lateral resolution when implemented in a line scan scheme can provide a limited lateral resolution. The astigmatism can come from the rays that fan out in the plane of FIG. 5 having a different incident angle on the finite glass plate of the beam splitter 104 and, thus, a different Optical Path Difference (ODP) than that of the rays that fan out perpendicular to the plane. Thus, the rays that fan out in the plane have a different focal point from the rays that fan out perpendicular to the plane. This astigmatism can provide advantage in a line scan layout, where the points along the line are in focus along the line direction to provide lateral resolution and are out of focus perpendicular to the scanning line that can provide maximum sensitivity to height on the wafer 106. However, this astigmatism magnitude may be a function of refractive index of the beam splitter 104 and a function of wavelength of light source 101. This chromatic behavior can prevent the effectiveness of this technique.

To address the chromatic issue, a complementary plate 109 is provided. Reflected light 108 from the wafer 106 is projected through the objective lens 105 and the complementary plate 109. For example, if the complementary plate 109 has the same thickness and material as beam splitter 104, and is set at the same tilt angle at an opposite sign as shown in FIG. 5, a ray trace analysis shows that the chromatic behavior of the complementary plate 109 cancels out with the beam splitter 104, and the desired astigmatism is preserved.

FIG. 6 is an embodiment with four photodiodes 208, 209, 215, 216. The system 200 includes a knife-edge mirror (KEM) 201 to determine whether light is focused, under-focused, or over-focused.

Like the system 100 of FIG. 5, the beam splitter 104 in the finite conjugated system 200 can cause chromatic and astigmatism aberration that can lower the performance. Furthermore, the trade-off of focus offset and lateral resolution when implemented in a line scan scheme can provide a limited lateral resolution. A complementary plate 109 is provided to address these potential issues.

The focal point 204 for the reflected light 108 relative to the KEM 201 can be better seen in the inset of FIG. 6. As the boundary of the reflective film 202 and anti-reflection film 203 of the KEM 201 is at the middle of the focal point 204 (the Airy disk) of the reflected light 108, the reflective film 202 shears the reflected light 108 in a manner that the transmitted beam has a uniform intensity distribution across the beam. Reflected light 108 that passes through the KEM 201 is split into two quantities by a prism 205 with a highly reflective coating on two sides and each constituent beam projects through one of the optional lenses 206, 207 to one of the photodiodes 208, 209. Ideally, the prism 205 is placed at the pupil plane, via a relay lens when needed. The lenses 206, 207 are not necessary in an embodiment with a single point illumination on wafer and the reflected light 108 can be projected from the prism 205 directly to the one of the photodiodes 208, 209. The photodiodes 208, 209 can provide the same performance in terms of the photo-electron efficiency, time response, and electronic amplification gains.

In the system 200, the KEM 201 is tilted at an angle so that the beam section emerging from the R=1 range (i.e., from the reflective film 202) is delivered to the photodiodes 215, 216 through a prism 212 and one of the optional lenses 213, 214. The KEM 201 can be tilted to be at a non-perpendicular angle relative to the reflected light 108 (e.g., an axis of the reflected light 108). The lenses 213, 214 are not necessary in an embodiment with single point illumination on wafer and the reflected light 108 can be projected directly from the prism 212 to the one of the photodiodes 215, 216. The signals of the photodiodes 215, 216 provide redundant and complimentary measurement that can be used to improve accuracy and precision. For example, the photodiodes 208, 209, 215, 216 can provide multiple measurements, so that the final results can be the average of them. Thus, if there is systematic error, the systematical error can be split into symmetric and asymmetric parts, and the asymmetric part can be averaged out in the final calculation.

While photodiodes 208, 209, 215, 216 are disclosed, the embodiment of FIG. 6 can instead use photodiode arrays (PDAs). A PDA has an array of multiple areas that can detect a light beam. A photodiode or PDA can be used with a source slit 210. A source slit 210 may use one of the optional lenses 206, 207, 213, 214 to keep the lateral resolution along the slit direction.

The system 200 can use a source slit 210 to shape the light 102 into a line rather than a point. Such a source slit 210 may have a first dimension (e.g., the "length" of the source slit 210, which may be the y-direction) that is substantially greater than a second dimension (e.g., the "width" of the source slit 210, which may be the z-direction). In some exemplary embodiments, the source slit 210 may be 1 mm to 5 mm in length. For example, in an embodiment, the source slit 210 is 3 mm in length. Other lengths are possible. The width of the source slit 210 is generally sufficiently small that the source slit 210 may be considered to be one-dimensional. For example, the width of the source slit 210 may be similar to a diameter of a point beam in a traditional interferometer. For example, in some embodiments the source slit 210 may be 5 μm-30 μm in size.

Diffractive optics (not illustrated) also may be included to shape the light 102 into a line rather than a point before the light 102 is incident on the beam splitter 104 or the source slit 210. An illumination line 211 is incident on the wafer 106. The KEM 201 can be aligned so that its edge is parallel to the line of the reflected light 108. The boundary of the KEM 201 can be aligned to block half of the imaged line of the illumination line 211, no matter if the wafer 106 is focused, under-focused, or over-focused. However, the intensity distribution of the line on the pupil plane will be uniform when the wafer 106 is focused. The spot size of the illumination line 211 may be diffraction limited.

Characteristics of relative intensity change on photodiodes responding to focal point shift can be used to improve throughput. The KEM 201 can be used to determine whether light is focused, under-focused, or over-focused. Though more signals can be used, only two to four signals per x-y point may be needed to determine a height of the reflection point on a wafer, such as the wafer 106. This design is more robust and has lower cost than existing techniques and can be faster than white light interferometry. Especially for 3D inspection and metrology, embodiments of the system and method disclosed herein can provide better throughput, cost, and accuracy compared to existing techniques.

In an instance, the slit can be placed at the image position as shown in FIG. 6 and a one-dimensional array detector can be used to measure the transmitted intensity through the slit. This provides the measurement of the length of a line on the wafer 106.

In another instance, a two-dimensional array can be used without a slit. The two-dimensional array may have more pixels along the illumination line direction for high lateral resolution along the slit, and fewer pixels perpendicular to the illumination line direction. For example, 10 pixels may be used. The intensity distribution along these pixels (e.g., 10 pixels) can provide the measurement of the height of a point on wafer. Other operation modes are possible.

Since the astigmatism fans out as a ray from one point onto multiple pixels perpendicular to the slit, and the height of the point can be calculated from the intensity distribution along these pixels, it may not be necessary to use differential detection mode. Instead, one two-dimensional detector array without a slit can determine a height of an illuminated region of a wafer surface when the astigmatism technique disclosed herein is used.

Some or all of the sensors disclosed in FIG. 5 or FIG. 6 (e.g., photodiodes, bi-cell photodiodes, PDAs) can be electronically connected to a controller 115. The controller 115 can include a processor 116, an electronic data storage unit 117 in electronic communication with the processor 116, and a communication port 118 in electronic communication with the processor 116. The processor 116 can receive readings from the sensors in any suitable manner (e.g., via one or more transmission media, which may include "wired" and/or "wireless" transmission media) such that the controller 115 can receive the output generated by the sensors. The controller 115 may be configured to perform a number of functions using the output. Using the readings from the sensors, the processor 116 can be configured to determine a height of an illuminated region of the wafer surface (e.g., point or line) or whether a defect is present on or in the wafer surface. In another example, the controller 115 may be configured to send the output to an electronic data storage unit 117 or another storage medium without performing defect review on the output. The controller 115 may be further configured as described herein.

It is to be appreciated that the controller 115 may be implemented in practice by any combination of hardware, software, and firmware. Also, its functions as described herein may be performed by one unit, or divided up among different components, each of which may be implemented in turn by any combination of hardware, software and firmware. Program code or instructions for the controller 115 to implement the various methods and functions described herein may be stored in controller readable storage media, such as a memory in the electronic data storage unit 117, within the controller 115, external to the controller 115, or combinations thereof.

An additional embodiment relates to a non-transitory computer-readable medium storing program instructions executable on a controller for performing a computer-implemented method for determining a height of an illuminated region on a surface of a wafer, as disclosed herein. In particular, as shown in FIGS. 5 and 6, electronic data storage unit 117 or other storage medium may contain non-transitory computer-readable medium that includes program instructions executable on the controller 115. The computer-implemented method may include any step(s) of any method(s) described herein.

Program instructions implementing methods such as those described herein may be stored on computer-readable medium, such as in the electronic data storage unit 117 or other storage medium. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

While not illustrated in FIG. 5 or FIG. 6, these systems can include a relay, such as the relay 119 of FIG. 1.

Figure 7:
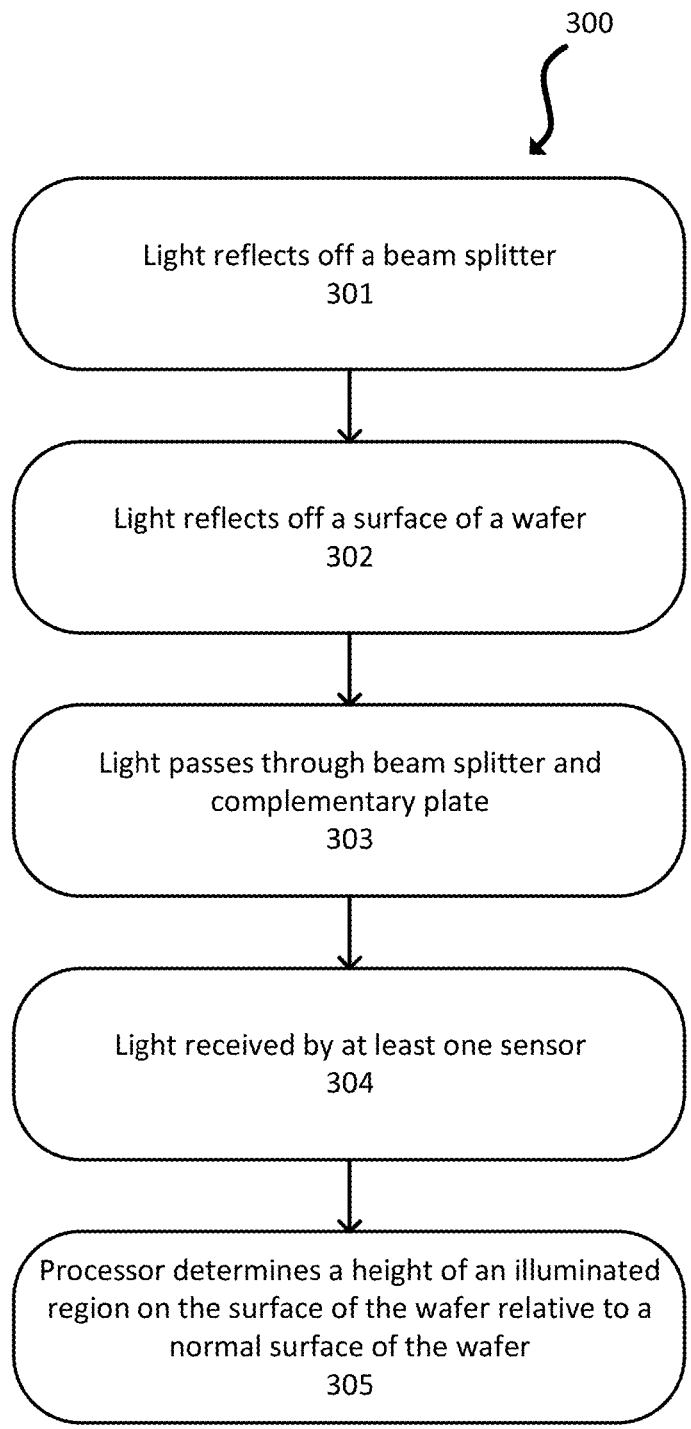
FIG. 7 is a flowchart in accordance with the present disclosure.

FIG. 7 is a flowchart of a method. In method 300, light reflects 301 off a beam splitter and reflects 302 off a surface of a wafer. The light passes 303 through the beam splitter and a complementary plate. The complementary plate is configured to create astigmatism and to remove chromatic aberration. The light is received 304 with at least one sensor after the light passes through the complementary plate. A processor determines 305 a height of an illuminated region on the surface of the wafer relative to a normal surface of the wafer using a reading from the at least one sensor.

While photodiodes are disclosed in the embodiments herein, other sensors such as bi-cell photodiodes or photodiode arrays also can be used.

The wafer may scan relative to the light in the x-direction and/or y-direction using the stage in the embodiments disclosed herein. This can provide surface topography information for an area of the surface of the wafer. This area may be, for example, a patch image, a full wafer inspection, or desired points as a bump-height inspection.

It should be noted that embodiments disclosed herein may determine a surface height profile of a wafer without scanning in the z-direction, although the stage may be capable of movement in the z-direction for other purposes.

Embodiments of the systems disclosed herein may need to be calibrated. Calibration can include determining the relationship of the relative signal difference (e.g., the ratio of the difference of pixels to the sum of them) to a known height difference.

Power to the laser light source can be controlled, such as through modulating or pulsing, which can enable strobing. In an instance, during operation of embodiments disclosed herein, the optics can be kept steady or otherwise fixed and the wafer can move in a direction perpendicular to the illumination line in synchronization with a PDA readout timer. Strobe technology, such as that caused by modulating the laser and synchronizing the laser with the PDA readout, can provide further spatial improvement because strobing can reduce blurring due to motion of a stage, such as the stage 117.

Embodiments of the systems disclosed herein can be used for inspection or metrology of a wafer. A height of the wafer surface or whether defects are present on or in the wafer surface can be used as feedback during semiconductor manufacturing.

Multiple design parameters of embodiments of the systems disclosed herein can be optimized. For example, height sensitivity, which relates to the signal change versus focus, is inversely proportional to the square of the objective NA. The relative high NA may be adjusted, though many applications require an NA of greater than 0.25. A high NA objective typically provides a smaller field of view, which results in higher spatial (x– and y–) resolution and slower operation.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:
1. A system comprising:
a light source configured to provide light;
a stage configured to hold a wafer to receive the light from the light source;
a beam splitter;
a complementary plate disposed in a path of the light reflected from the wafer and the beam splitter, wherein the complementary plate is configured to create astigmatism and to remove chromatic aberration;
a sensor configured to receive the light reflected from the wafer, wherein the sensor comprises two photodiodes;
a processor in electrical communication with the sensor, wherein the processor is configured to determine a height of an illuminated region on a surface of the wafer relative to a normal surface of the wafer;
a knife-edge mirror configured to receive light reflected from the wafer, wherein the knife-edge mirror includes a reflective film and an anti-reflection film that are both disposed on the knife-edge mirror thereby forming a boundary between the reflective film and the anti-reflection film, wherein the knife-edge mirror is positioned at a focal point of the light reflected from the wafer such that the reflective film is configured to block at least some of the light reflected from the wafer, wherein the knife-edge mirror is configured such that a portion of the light blocked by the knife-edge mirror is different when the light reflected from the wafer is under-focused or over-focused, and wherein the knife-edge mirror is positioned at a non-perpendicular angle relative to an axis of the light reflected from the wafer; and
a second sensor configured to receive the light reflected from the wafer that is reflected by the knife-edge mirror, wherein the second sensor comprises two photodiodes.

2. The system of claim 1, wherein the complementary plate is configured to remove at least 99.9% of the chromatic aberration.

3. The system of claim 1, wherein the sensor detects whether the light reflected from the wafer is under-focused or over-focused.

4. The system of claim 1, wherein the two photodiodes of the sensor receive different quantities of the light reflected from the wafer when the light reflected from the wafer is under-focused or over-focused.

5. The system of claim 1, wherein the stage is configured to scan the wafer relative to the light from the light source.

6. The system of claim 1, wherein the complementary plate is fabricated of the same material and has the same thickness as the beam splitter.

7. The system of claim 1, wherein the complementary plate is positioned at an angle opposite that of the beam splitter relative to an axis of the light.

8. The system of claim 1, wherein the light is configured to be projected onto the wafer in a line.

9. The system of claim 8, further comprising a slit configured to shape the light.

10. A method comprising:
reflecting light off a beam splitter;
reflecting the light off a surface of a wafer;
passing the light through the beam splitter and a complementary plate, wherein the complementary plate is configured to create astigmatism and to remove chromatic aberration; and
passing the light through a knife-edge mirror, wherein the knife-edge mirror includes a reflective film and an anti-reflection film that are both disposed on the knife-edge mirror thereby forming a boundary between the reflective film and the anti-reflection film, and wherein the knife-edge mirror is positioned at a focal point of the light reflected from the wafer such that the reflective film is configured to block at least some of the light reflected from the wafer and such that a portion of the light blocked by the knife-edge mirror is different when the light reflected from the wafer is under-focused or over-focused.

11. The method of claim 10, wherein at least 99.9% of the chromatic aberration is removed using the complementary plate.

12. The method of claim 10, further comprising:
receiving the light with at least one sensor after the light passes through the complementary plate; and
determining, using a processor, a height of an illuminated region on the surface of the wafer relative to a normal surface of the wafer using a reading from the at least one sensor.

13. The method of claim 10, further comprising:
splitting the light from the knife-edge mirror into two quantities; and
determining whether the quantities are equal.

14. The method of claim 10, further comprising reflecting part of the light from the knife-edge mirror to a second sensor.

15. The method of claim 10, further comprising shaping the light projected onto the wafer into a line.

16. The method of claim 10, further comprising scanning the wafer relative to the light.

* * * * *